(12) United States Patent
Chen et al.

(10) Patent No.: US 6,887,745 B2
(45) Date of Patent: May 3, 2005

(54) POLYSILICON THIN FILM TRANSISTOR AND METHOD OF FORMING THE SAME

(75) Inventors: Kun-Hong Chen, Taipei (TW); Chinwei Hu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 10/605,084

(22) Filed: Sep. 8, 2003

(65) Prior Publication Data

US 2004/0104431 A1 Jun. 3, 2004

(30) Foreign Application Priority Data

Sep. 26, 2002 (TW) ........................................ 91122107 A

(51) Int. Cl.⁷ .......................................... H01L 21/8238
(52) U.S. Cl. ...................... 438/154; 438/163; 438/164; 438/517; 438/527; 438/546; 438/548; 438/554; 438/680
(58) Field of Search ................................ 438/149, 151, 438/154, 163, 164, 517, 527, 546, 548, 554, 680, FOR 201, FOR 312, 166

(56) References Cited

U.S. PATENT DOCUMENTS

| 4,402,128 A | * | 9/1983 | Blackstone | .................. 438/149 |
| 5,482,871 A | * | 1/1996 | Pollack | ....................... 438/151 |
| 2002/0076862 A1 | * | 6/2002 | Lu et al. | ....................... 438/149 |
| 2002/0179927 A1 | * | 12/2002 | Lu et al. | ....................... 257/151 |

* cited by examiner

*Primary Examiner*—George Fourson
*Assistant Examiner*—Joannie Adelle Garcia
(74) *Attorney, Agent, or Firm*—Jiang Chyun IP office

(57) ABSTRACT

A polysilicon thin film transistor and a method of forming the same is provided. A poly-island layer is formed over a substrate. A gate insulation layer is formed over the poly-island layer. A gate is formed over the gate insulation layer. Using the gate as a mask, an ion implantation of the poly-island layer is carried out to form a source/drain region in the poly-island layer outside the channel region. An oxide layer and a silicon nitride layer, together serving as an inter-layer dielectric layer, are sequentially formed over the substrate. Thickness of the oxide layer is thicker than or the same as (thickness of the nitride layer multiplied by 9000 Å)$^{1/2}$ and maximum thickness of the nitride layer is smaller than 1000 Å.

5 Claims, 5 Drawing Sheets

POLYSILICON THIN FILM TRANSISTOR AND METHOD OF FORMING THE SAME

CROSS REFERENCE TO RELATED APPLICATIONS

This application claims the priority benefit of Taiwan application serial no. 91122107, filed on Sep. 26, 2002.

BACKGROUND OF INVENTION

1. Field of Invention

The present invention relates to a thin film transistor and manufacturing method thereon. More particularly, the present invention relates to a polysilicon thin film transistor and method of forming the same.

2. Description of Related Art

Due to rapid progress in electronic technologies, digitized video or imaging device has become an indispensable product in our daily life. Among the video or imaging products, displays are the principle devices for providing information. Through a display device, a user is able to obtain information or to control various operations. To facilitate the users, most video or imaging equipment is now designed with a slim and fairly light body. With breakthroughs in optoelectronic technologies and advances in semiconductor fabrication techniques, flat panel type of displays such as a thin film transistor liquid crystal display (TFT-LCD) are now in the market.

Recently, a technique for forming a thin film transistor liquid crystal display fabricated having polysilicon thin film transistors has been developed. The thin film transistor in this type of display has electron mobility much greater than a conventional amorphous silicon (a-Si) type of thin film transistor. Since a display with a smaller thin film transistor and a larger aperture ratio can be produced, a brighter display with lower power consumption is obtained. Moreover, due to the increase in electron mobility, a portion of the driving circuit and the thin film transistor may be fabricated on a glass substrate together at the same time. Thus, reliability and quality of the liquid crystal display panel is improved and the production cost relative to a conventional amorphous silicon type of thin film transistor liquid crystal display is much lower. Furthermore, because polysilicon is a lightweight material with the capacity to produce high-resolution display without consuming too much power, polysilicon thin film transistor display is particularly appropriate for installing on a portable product whose body weight and energy consumption is critical.

Earlier generations of polysilicon thin film transistor were fabricated using solid phase crystallization (SPC) method at temperature higher than 1000° C. With such a high processing temperature, a quartz substrate must be used. Since a quartz substrate costs more than a glass substrate and is also subject to dimensional limitation (not more than 2 to 3 inches in size), polysilicon thin film transistor is only used in small panel display. Now, with the development of laser and maturation of laser crystallization or excimer laser annealing (ELA) techniques, an amorphous silicon film can be easily re-crystallized into polysilicon through a laser scanning operation at a temperature below 600° C. Hence, a glass substrate suitable for forming conventional amorphous silicon TFT-LCD can also be used to fabricate a polysilicon TFT-LCD having larger panel size. Because a lower fabrication temperature is required, this type of polysilicon is often referred to as a low temperature polysilicon (LTPS).

FIGS. 1A to 1C are cross-sectional views showing the progression of steps for fabricating a conventional polysilicon thin film transistor. First, as shown in FIG. 1A, a poly-island layer 102 is formed over a substrate 100. A gate insulation layer 104 is formed over the poly-island layer 102. Because the poly-island layer 102 is formed by recrystallizing an amorphous silicon using a laser crystallization or excimer laser annealing (ELA) process, the poly-island layer 102 contains numerous crystalline defects that often trap mobile electrons.

As shown in FIG. 1B, a gate 106 is formed over the gate insulation layer 104. The gate 106 sits directly on top of that portion of the poly-island layer 102 destined to form a channel region. Thereafter, using the gate 106 as a mask, an ion implantation 108 is carried out to form source/drain regions 102a in the poly-island layer 102 outside the gate-covered region.

To reduce the number of crystalline defects in the poly-island layer 102, a hydrogen-rich silicon oxide layer 110 is formed over aforementioned layers as shown in FIG. 1C. The hydrogen-rich silicon oxide layer 110 is annealed so that the hydrogen atoms within the oxide layer 110 are diffused into the crystalline defects within the poly-island layer 102. In addition, the oxide layer 110 also serves as an inter-layer oxide inside the polysilicon thin film transistor. However, this type of polysilicon thin film transistor has very little leeway for additional improvement of electrical characteristics.

SUMMARY OF INVENTION

Accordingly, one object of the present invention is to provide a polysilicon thin film transistor and fabricating method thereof that can improve the electrical characteristics of the polysilicon thin film transistor.

A second object of the invention is to provide a polysilicon thin film transistor and fabricating method thereof that can reduce threshold voltage (Vt) and increase electron mobility of both N-type thin film transistor (N-TFT) and P-type thin film transistor (P-TFT).

To achieve these and other advantages and in accordance with the purpose of the invention, as embodied and broadly described herein, the invention provides a polysilicon thin film transistor. The polysilicon thin film transistor comprises a poly-island layer, a gate, a gate insulation layer and an inter-layer dielectric layer that includes an oxide layer and a silicon nitride layer. The gate is formed over the poly-island layer. The gate insulation layer is located between the gate and the poly-island layer. The oxide layer within the inter-layer dielectric layer is formed over the gate and the gate insulation layer. The silicon nitride layer within the inter-layer dielectric layer is formed over the oxide layer. The oxide layer and the silicon nitride layer of the inter-layer dielectric layer have a thickness relationship given by the following inequality: $T_{ox} \geq (T_{nitride} \times 9000 \text{ Å})^{1/2}$; Here, $T_{ox}$ represents the thickness of the oxide layer (in Å); $T_{nitride}$ represents thickness of the silicon nitride layer and that 50 Å $< T_{nitride} <$ 1000 Å.

This invention also provides a method of fabricating a polysilicon thin film transistor. First, a poly-island layer is formed over a substrate. Next, a gate insulation layer is formed over the poly-island layer. Thereafter, a gate is formed over the gate insulation layer above a section of the poly-island layer destined to form a channel region. Using the gate as a mask, an ion implantation of the poly-island layer is carried out to form a source/drain region in the poly-island layer outside the channel region. An oxide layer and a silicon nitride layer, together serving as an inter-layer dielectric layer, are sequentially formed over the substrate. The oxide layer and the silicon nitride layer of the inter-layer dielectric layer have a thickness relationship given by the following inequality: $T_{ox} \geq (T_{nitride} \times 9000 \text{ Å})^{1/2}$; Here, $T_{ox}$ represents the thickness of the oxide layer (in Å); $T_{nitride}$ represents thickness of the silicon nitride layer and that $50 \text{ Å} < T_{nitride} < 1000 \text{ Å}$.

In this invention, electrical properties of a polysilicon thin film transistor are improved through forming an inter-layer dielectric layer that includes an oxide layer and a nitride layer as well as manipulating the thickness relationship between the oxide layer and the nitride layer.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1A:
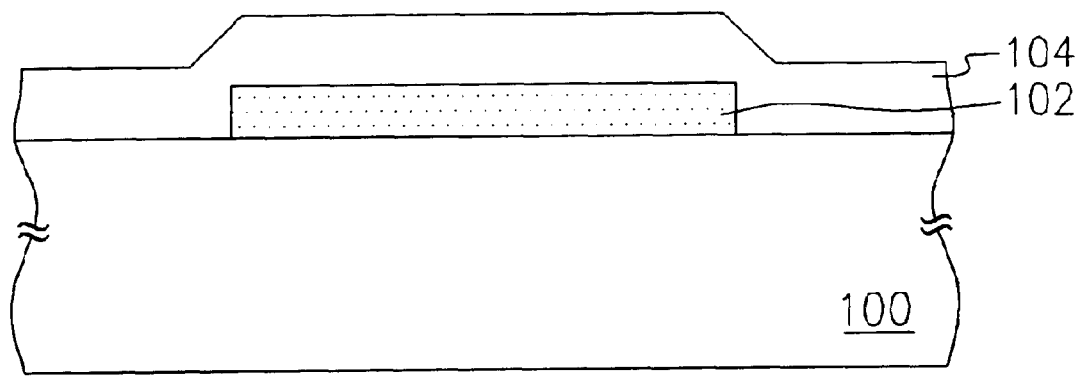
FIGS. 1A to 1C are cross-sectional views showing the progression of steps for fabricating a conventional polysilicon thin film transistor.
Figure 1B:
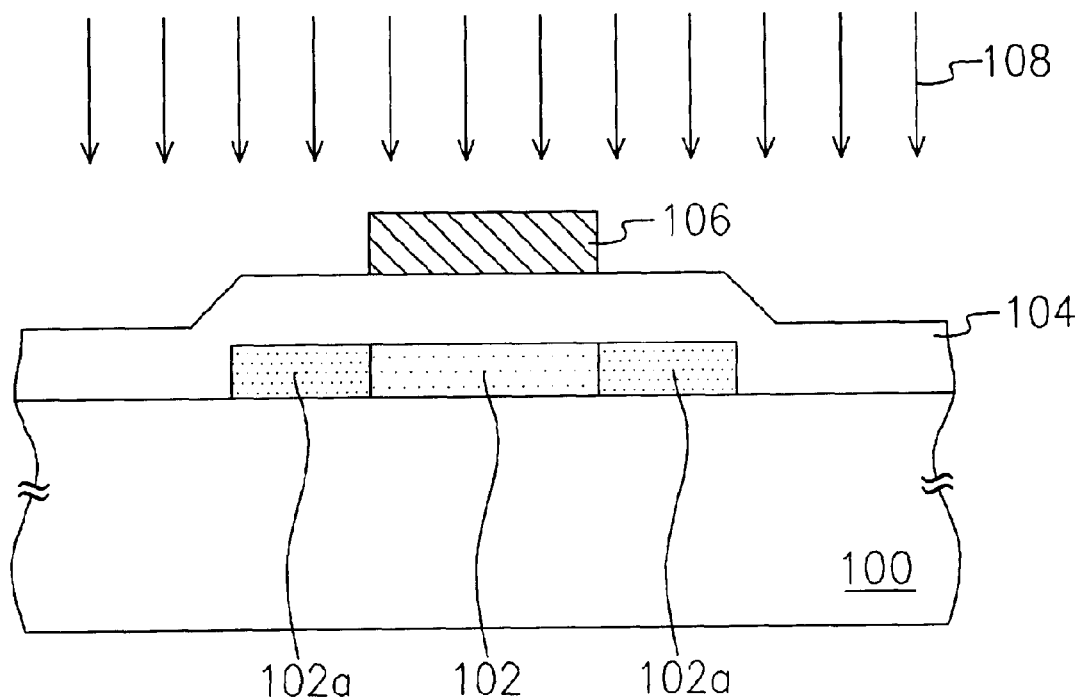
Figure 1C:
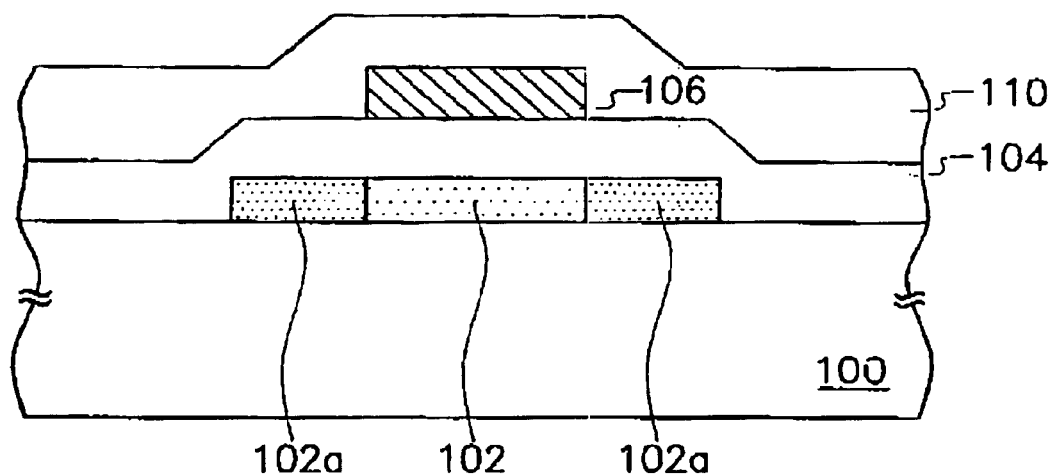

Reference will now be made in detail to the present preferred embodiments of the invention, examples of which are illustrated in the accompanying drawings. Wherever possible, the same reference numbers are used in the drawings and the description to refer to the same or like parts.

Figure 2:
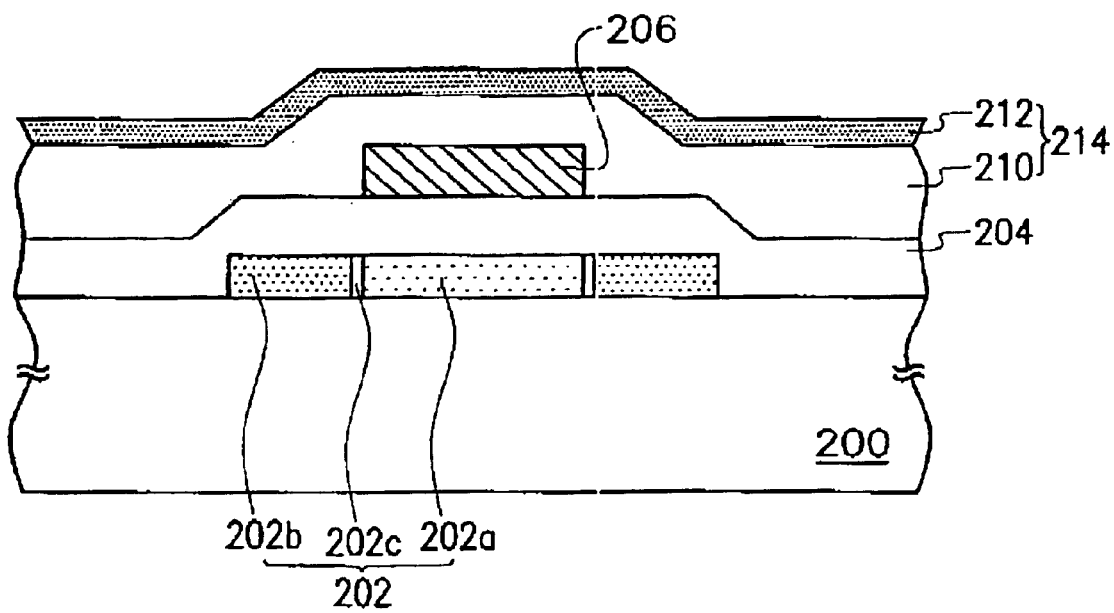
FIG. 2 is a schematic cross-sectional view of a polysilicon thin film transistor according to one preferred embodiment of this invention.

FIG. 2 is a schematic cross-sectional view of a polysilicon thin film transistor according to one preferred embodiment of this invention. As shown in FIG. 2, the polysilicon thin film transistor of this invention is formed over a substrate 200. The polysilicon thin film transistor comprises a poly-island layer 202, a gate 206, a gate insulation layer 204 and an inter-layer dielectric (ILD) layer 214 that includes an oxide layer 210 and a nitride layer 212. The poly-island layer 202 includes a channel region 202a underneath the gate 206 and source/drain regions 202b on each side of the channel region 202a. In addition, when the polysilicon thin film transistor is an N-type polysilicon thin film transistor, a lightly doped drain (LDD) structure 202c may be formed between the channel region 202a and the source/drain regions 202b. The aforementioned layers are arranged such that the gate 206 is formed over the channel region 202a of the poly-island layer 202 and the gate insulation layer 204 is formed between the gate 206 and the poly-island layer 202. The oxide layer 210 of the inter-layer dielectric layer is formed over the gate 206 and the gate insulation layer 204 and the nitride layer 212 is formed over the oxide layer 210. The oxide layer 210 and the nitride layer 212 of the inter-layer dielectric layer 214 have a thickness relationship given by the following inequality: $T_{ox} \geq (T_{nitride} \times 9000 \text{ Å})^{1/2}$; Here, $T_{ox}$ represents the thickness of the oxide layer 210 (in Å); $T_{nitride}$ represents thickness of the nitride layer 212 and that $50 \text{ Å} < T_{nitride} < 1000 \text{ Å}$.

Figure 3A:
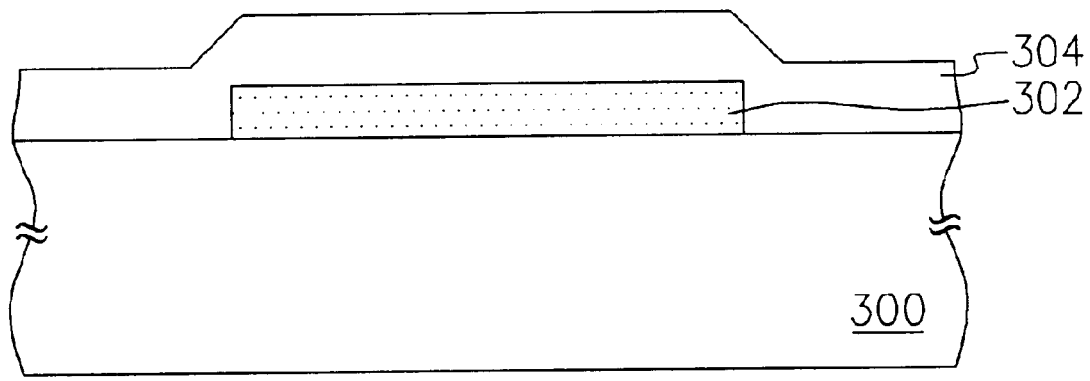
FIGS. 3A to 3C are cross-sectional views showing the progression of steps for fabricating the polysilicon thin film transistor shown in FIG. 2.
Figure 3B:
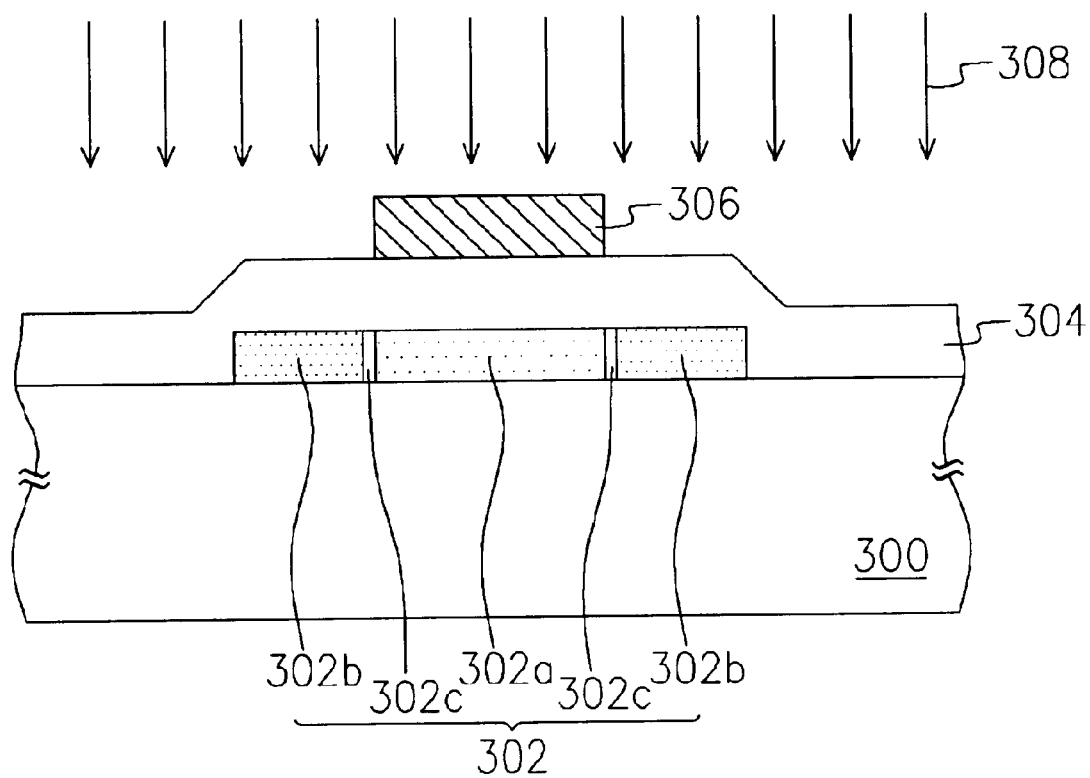
Figure 3C:
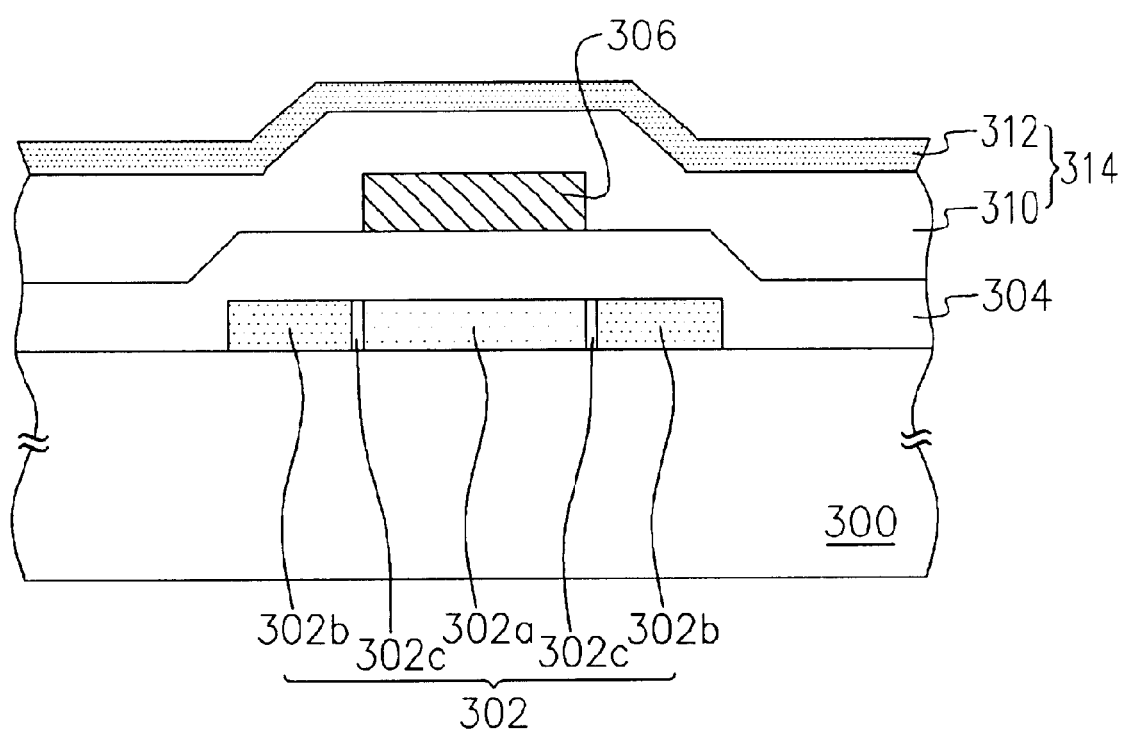

FIGS. 3A to 3C are cross-sectional views showing the progression of steps for fabricating the polysilicon thin film transistor shown in FIG. 2. As shown in FIG. 3A, a poly-island layer 302 is formed over a substrate 300. The poly-island layer 302 is formed, for example, by depositing amorphous silicon over the substrate 300 and conducting a laser crystallization or excimer laser annealing (ELA) process. Thus, the amorphous silicon melts and re-crystallizes at a temperature of about 600° C. into polysilicon. Thereafter, photolithographic and etching processes are carried out to form the poly-island layer 302 as shown in FIG. 3A. A channel ion implantation process may also be carried out to dope the poly-island layer 302. According to the type of ionic dopants used in the implantation, N-type or P-type channel is produced. Thereafter, a gate insulation layer 304 is formed over the poly-island layer 302. The gate insulation layer 304 is formed, for example, by conducting a plasma-enhanced chemical vapor deposition (PECVD).

As shown in FIG. 3B, a gate 306 is formed over the gate insulation layer 304 above an area destined for forming the channel region 302a. Using the gate 306 as a mask, an ion implantation 308 of the poly-island layer 302 is carried out to form source/drain regions 302b in the poly-island layer 302 outside the channel region. The ion implantation 308 is conducted using ionic beams containing ions such as arsenic, phosphorus or boron accelerated to a suitable energy level. The ionic beam penetrates through the gate insulation layer 204 on each side of the gate 206 to form P+-type or N+-type source/drain regions in the poly-island layer 302. Furthermore, a lightly doped drain (LDD) structure 302c may also be formed between the source/drain region 302b and the channel region 302a.

As shown in FIG. 3C, an oxide layer 310 and a nitride layer 312 are sequentially formed over the gate 306 and the gate insulation layer 304. The oxide layer 310 and the nitride layer 312 together serve as an inter-layer dielectric layer 314. The oxide layer 310 and the nitride layer 312 of the inter-layer dielectric layer 314 have a thickness relationship given by the following inequality: $T_{ox} \geq (T_{nitride} \times 9000 \text{ Å})^{1/2}$; Here, $T_{ox}$ represents the thickness of the oxide layer 310 (in Å); $T_{nitride}$ represents thickness of the nitride layer 312 and that $50 \text{ Å} < T_{nitride} < 1000 \text{ Å}$.

Figure 4:
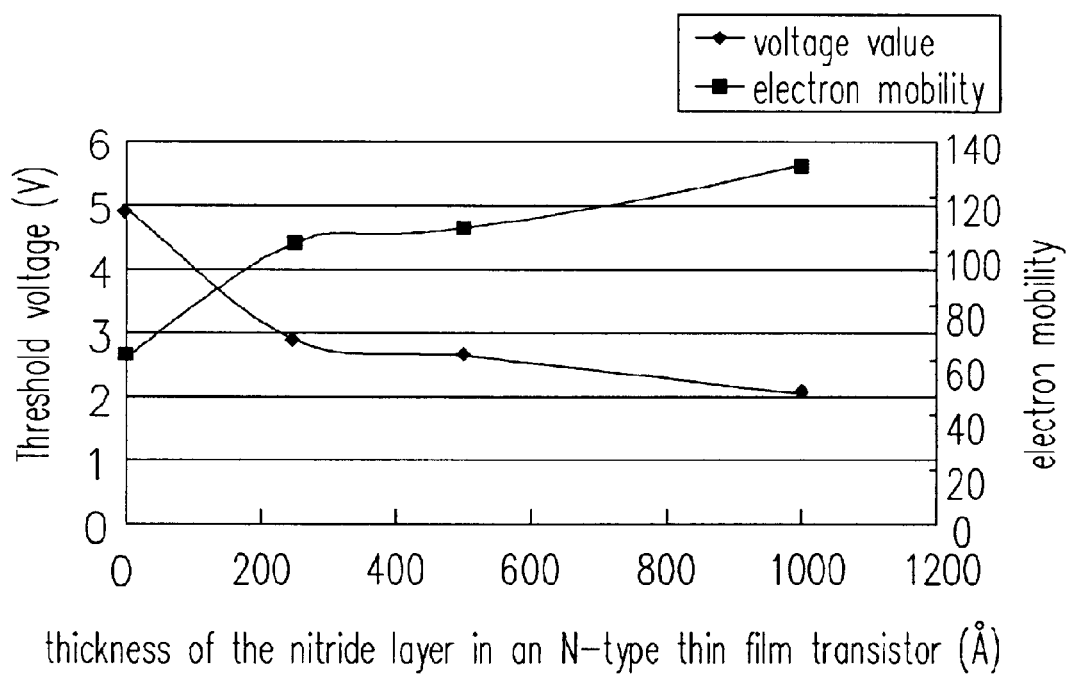
FIGS. 4 and 5 are graphs showing the variation of threshold voltage and electron mobility with thickness of the silicon nitride layer for N-type and P-type polysilicon thin film transistors respectively.
Figure 5:
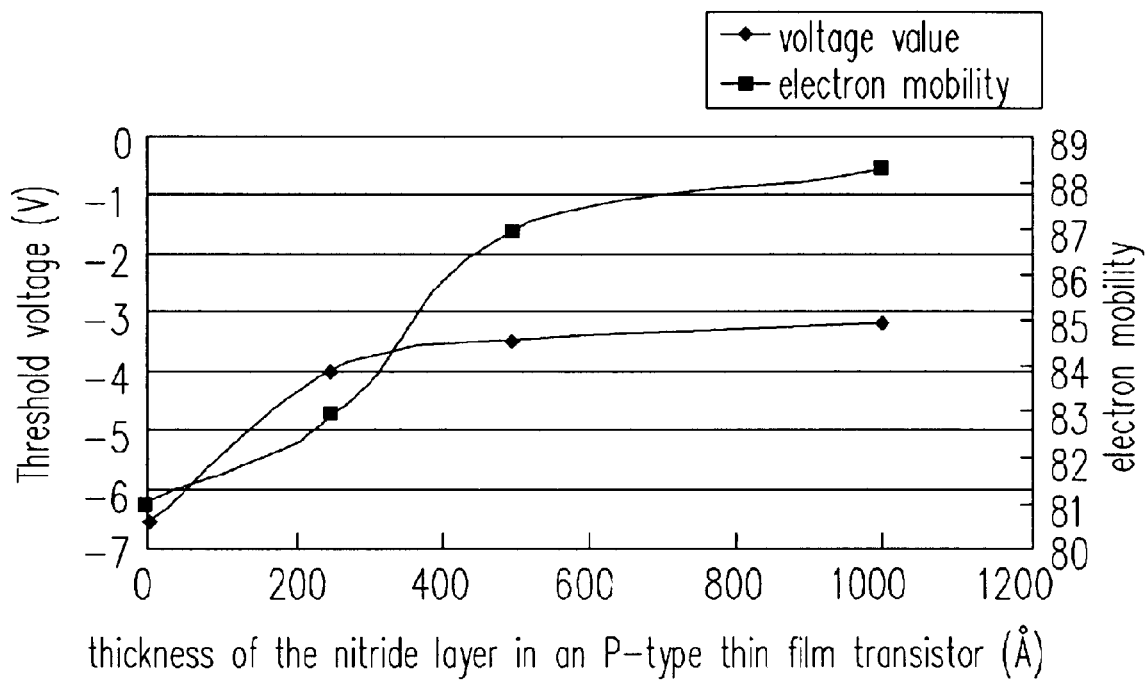

To show the improvement in electrical characteristics of the polysilicon thin film transistor fabricated according to this invention, refer to the graphs in FIGS. 4 and 5. FIGS. 4 and 5 are graphs showing the variation of threshold voltage (Vt) and electron mobility with thickness of the silicon nitride layer for N-type and P-type polysilicon thin film transistor (TFT) respectively. As shown in FIGS. 4 and 5, the threshold voltage for N-type TFT is about 5V, the threshold voltage for P-type TFT is about 6.5V, the electron mobility of N-type TFT is about 60 $cm^2$/V-sec and the electron mobility of P-type TFT is about 80 $cm^2$/V-sec before adding a nitride layer (that is, the nitride layer has zero thickness). With the addition of a nitride layer, absolute value of the of both N-type and P-type TFT drops with increase in thickness of the nitride layer and the electron mobility of the N-type and P-type TFT increases with increase in thickness.

As observed in FIGS. 4 and 5, there is prominent improvement in the electrical characteristics of the TFT as thickness of the nitride layer is increased beyond 50 Å. When thickness of the nitride layer approaches 1000 Å, the threshold voltage and the electron mobility of both N-type and P-type polysilicon TFT remains near constant values. Hence, with due consideration regarding the overall size of a device, the nitride layer preferably has a thickness below 1000 Å so that property improvements will not counter device miniaturization.

In conclusion, this invention improves the electrical properties of a polysilicon thin film transistor by forming an inter-layer dielectric layer that includes an oxide layer and a nitride layer and optimizing the thickness relationship between the oxide layer and the nitride layer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a polysilicon thin film transistor, comprising the steps of:

forming a poly-island layer over a substrate;

forming a gate insulation layer over the poly-island layer;

forming a gate electrode over the gate insulation layer above a section of the poly-island layer destined for forming a channel region;

conducting an ion implantation of the poly-island layer using the gate electrode as a mask to form source/drain regions in the poly-island layer outside the channel region; and sequentially forming an oxide layer and a nitride layer over the substrate to cover the gate electrode and the gate insulation layer, wherein the oxide layer and the nitride layer serving as an inter-layer dielectric layer have a thickness relationship given by the equation: $T_{ox} \geq (T_{nitride} \times 9000 \text{ Å})^{1/2}$, where $T_{ox}$ represents the thickness of the oxide layer (in Å), $T_{nitride}$ represents thickness of the silicon nitride layer and that thickness of the nitride layer is between 50 Å and 1000 Å.

2. The method of claim 1, wherein the step of forming the poly-island layer over the substrate includes the sub-steps of:

depositing amorphous silicon over the sub-substrate;

conducting a laser crystallization or an excimer laser annealing process to melt the amorphous silicon and re-crystallize into a polysilicon layer; and conducting photolithographic and etching processes to form islands of polysilicon.

3. The method of claim 1, wherein after forming the poly-island layer over the substrate, further includes conducting a channel ion implantation so that the poly-island layer contains dopants.

4. The method of claim 1, wherein the step of forming a gate insulation layer over the poly-island layer includes carrying out a plasma-enhanced chemical vapor deposition.

5. The method of claim 1, wherein the method further include the step of forming a lightly doped drain structure between the source/drain region and the channel region.

* * * * *